United States Patent
Mahon

(10) Patent No.: US 11,762,000 B1
(45) Date of Patent: Sep. 19, 2023

(54) DISTORTION/INTERFERENCE MEASUREMENT DEVICE FOR VIRTUAL REALITY ENVIRONMENTS

(71) Applicant: PENUMBRA, INC., Alameda, CA (US)

(72) Inventor: Cameron J. Mahon, Guelph (CA)

(73) Assignee: Penumbra, Inc., Alameda, CA (US)

( * ) Notice: Subject to any disclaimer, the term of this patent is extended or adjusted under 35 U.S.C. 154(b) by 0 days.

(21) Appl. No.: 17/841,844

(22) Filed: Jun. 16, 2022

(51) Int. Cl.
| | |
|---|---|
| *G09G 5/00* | (2006.01) |
| *G01R 29/08* | (2006.01) |
| *G06F 3/0346* | (2013.01) |
| *G06F 3/01* | (2006.01) |
| *G06F 3/14* | (2006.01) |

(52) U.S. Cl.
CPC .......... *G01R 29/0892* (2013.01); *G06F 3/011* (2013.01); *G06F 3/0346* (2013.01); *G06F 3/14* (2013.01)

(58) Field of Classification Search
CPC ... G01R 29/0892; G06F 3/011; G06F 3/0346; G06F 3/14
USPC .......................................................... 345/156
See application file for complete search history.

(56) References Cited

U.S. PATENT DOCUMENTS

| 4,737,744 | A | 4/1988 | Hayward et al. | |
|---|---|---|---|---|
| 2019/0086482 | A1* | 3/2019 | Chung | G01S 5/16 |
| 2019/0242952 | A1* | 8/2019 | Schneider | G06F 3/017 |
| 2020/0400856 | A1* | 12/2020 | Castleman | G01V 3/108 |
| 2021/0240426 | A1* | 8/2021 | Braden | H04N 7/147 |
| 2022/0035443 | A1* | 2/2022 | Winold | A61B 5/1123 |

\* cited by examiner

*Primary Examiner* — Jennifer T Nguyen
(74) *Attorney, Agent, or Firm* — Haley Guiliano LLP

(57) ABSTRACT

A measurement device and methods for detecting distortion or interference in an environment are described herein. The measurement device comprises a transmitter and a receiver attached to a rigid body such that a position and orientation (P&O) of the receiver with respect to the transmitter is fixed. When measuring distortion, the transmitter transmits electromagnetic waves over one or more frequency channels and measures electromagnetic waves over the channel(s) and a P&O of the receiver relative to the transmitter may be computed. Based on the computed P&O and the known P&O of the receiver with respect to the transmitter, the system determines a level of distortion that would cause the change in position and orientation. When measuring interference, the transmitter does not transmit electromagnetic waves and the receiver measures the electromagnetic waves in the environment. The measurement device is moved to identify locations where the measurements of distortion and/or interference are below a threshold value.

15 Claims, 11 Drawing Sheets

EXPLORATON TOOL USAGE

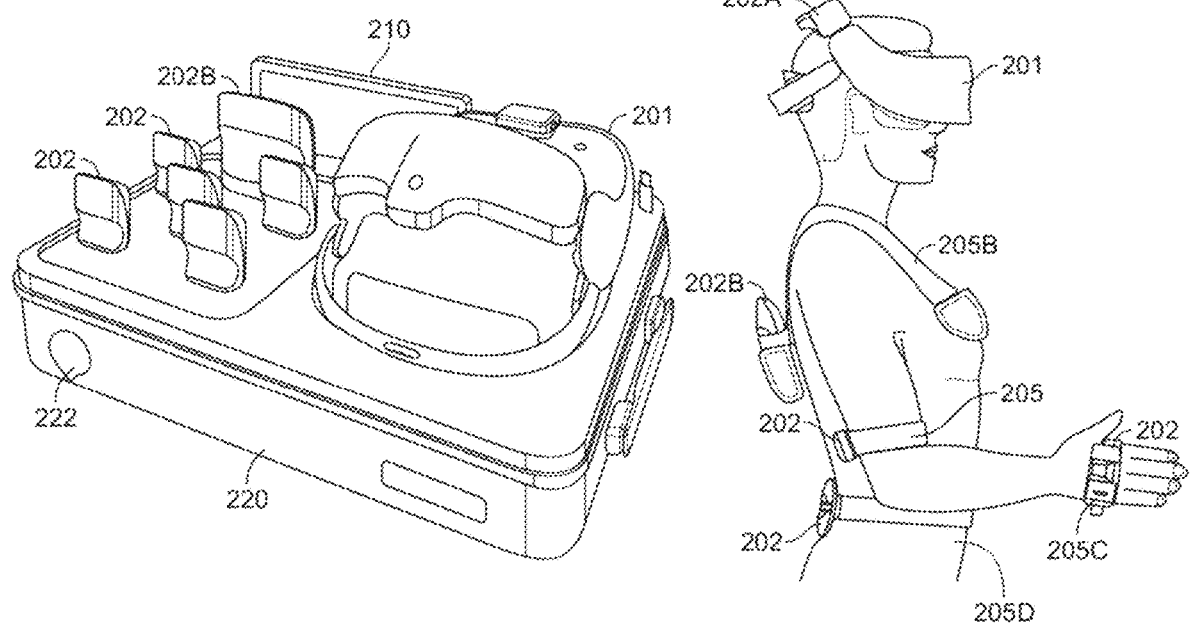
FIG. 1A   FIG. 1B
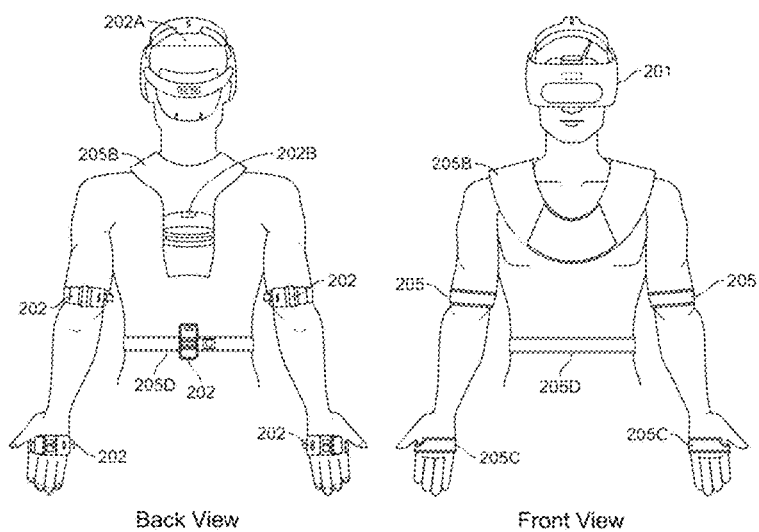
FIG. 1C

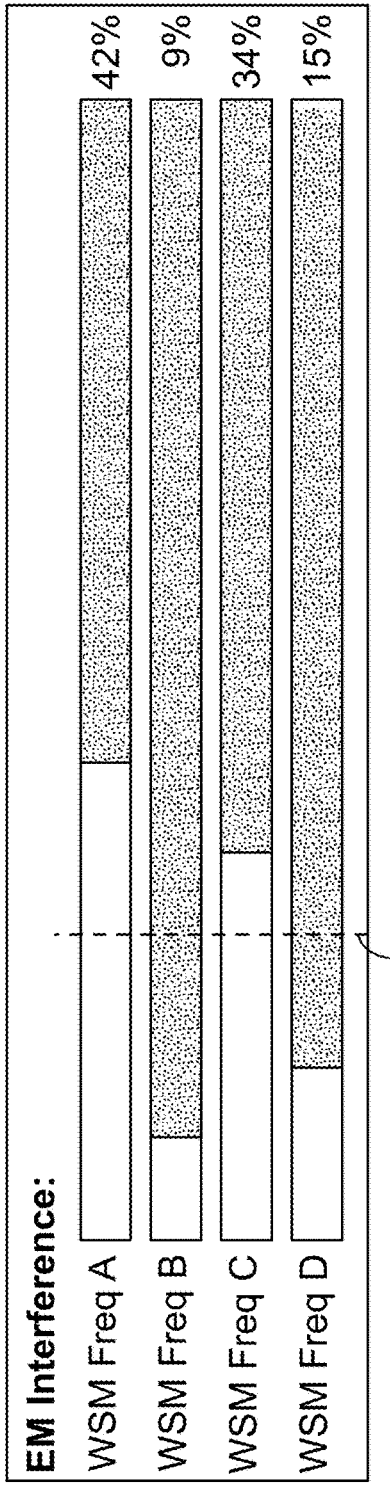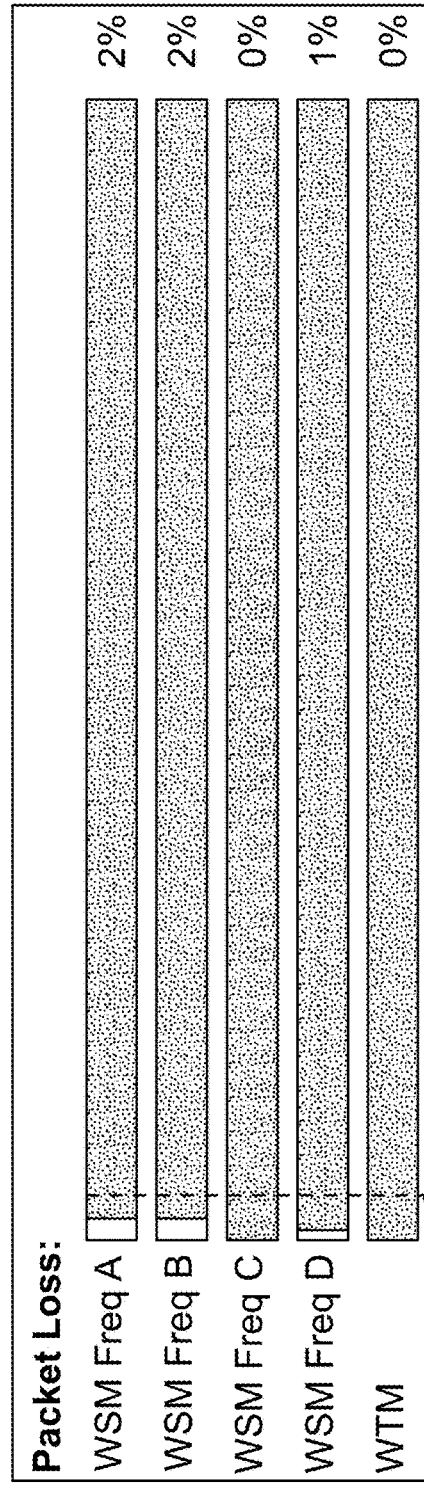
FIG. 8

DISTORTION/INTERFERENCE MEASUREMENT DEVICE FOR VIRTUAL REALITY ENVIRONMENTS

FIELD OF THE INVENTION

The present invention relates generally to the magnetic tracking devices, and more particularly to the measurement devices for measuring interference or distortion which may affect magnetic tracking devices.

BACKGROUND

Many Virtual Reality (VR) systems include a VR headset with a display and one or more devices that can be attached, worn, or held by a user such that the locations of the devices are represented in the virtual 3D display depicted on the display of the headset, thereby depicting the locations of body parts to which the devices are attached, worn, or held. These devices may be sensors, transmitters, receivers, or other devices that can send and receive signals and communicate with each other and a central module that processes all communications between the devices and the VR headset. One such exemplary system is the REAL® System, a trademark owned by Penumbra, Inc.

In some systems, magnetic fields are used to determine the location and coordinates of each of the devices to allow the relative locations of the devices to be depicted in the virtual 3D display. A transmitter in a central location transmits an electromagnetic signal. The sensors measure a strength of the electromagnetic signal and send the measurement to a central processing unit which determines positions and orientations of the sensors based on the measured strength of the electromagnetic signal.

One problem with using magnetic fields to determine location and coordinates of sensors is that the measurements of magnetic fields transmitted from the transmitter can be influenced by interference or distortion in an environment around the sensors. If interference or distortion changes the measurements of the magnetic signal at the receivers, the computed location and orientation of the sensors would also change, causing the sensors to appear as if they are moving when they are stationary, appear in the wrong location, or both moving and in the wrong location.

One solution to this issue is to build an environment that does not have sources of interference and few objects that distort the magnetic field. Distortion can be caused by nearby objects and thus can be reduced if all objects are removed from a room.

While the above solution can remove the effects of interference or distortion, it requires an environment to be built for the VR system, thereby limiting the usability of the system to those pre-built locations. Thus, this solution does not work for devices that are intended to be portable or setup in preexisting locations. Additionally, the solution of building an environment specifically for a VR headset is prohibitively expensive.

As such, there is a need for systems and methods that identify and quantify interference and distortion in an environment such that a VR system can be moved to a location with minimal interference and distortion or calibrated to reduce the effects of interference and distortion.

Embodiments are described herein for improved systems and methods for identifying and quantifying distortion and interference in an environment for a virtual reality system. A measurement device comprises a transmitter and receiver affixed to a rigid body at a fixed distance, such that the receiver is unable to move independent of the transmitter. Embodiments of the measurement device may additionally include means for detecting a switch from interference testing to distortion testing, such as a switch or accelerometer.

When identifying a new location to set up a VR headset, the measurement device is moved to the location and powered on to measure interference. In the interference measurement mode, the receiver is powered on to detect magnetic fields while the transmitter remains off. The receiver transmits measurements of magnetic fields to a computing device which displays the measurements in a graphical user interface. The graphical user interface may additionally include an indication as to whether the measured interference is greater than a threshold value. The measurement device can then be moved around the environment to find locations where the measured interference is lower than the threshold value or to identify sources of interference for removal.

When the measurement device receives a request to switch to distortion measurement mode, the transmitter is powered on and begins transmitting a magnetic field at a frequency monitored by the receiver. The request may include a physical press of a button or a movement of the measurement device in a specific way that is measured by the accelerometer, such as a rotation. With the transmitter on, the receiver sends measurements of the magnetic field to the computing device. The computing device computes a position and orientation of the receiver relative to the transmitter and compares the computed position and orientation of the receiver relative to the transmitter with a known position and orientation of the receiver relative to the transmitter on the rigid body. A graphical user interface displays levels of distortion in the environment as the measurement device is moved through the environment and may additionally include an indication as to whether the measured distortion is greater than a threshold value. Similar to the interference measurement, a location in the environment may be identified with low distortion by moving the measurement device around the environment. Additionally, or alternatively, the measurement device may be used to identify the distortion in a set-up location so that measurements in the set-up location may be corrected based on the measured distortion.

In some embodiments, the graphical user interface displayed on the computing device guides a user in activating the measurement device, such as by providing instructions. The computing device may additionally store a data file comprising a plurality of entries comprising measurements of electromagnetic fields with corresponding timestamps as to when the measurement was taken. The graphical user interface may include options for linking textual input or images with one or more entries. Thus, if an object in an environment is causing high levels of interference or distortion, an image of the object can be associated with the interference or distortion measurements. In some embodiments, the computing device additionally maps the distortion or interference in an environment, such as by receiving additional location data of the measurement device as the measurement device is moved through the environment and storing the location data with the entries.

In some embodiments, an auxiliary device stores software which is executed by the computing device to cause the computing device to display the graphical user interface and/or store the data file described herein. The auxiliary device may include a computer interface, such as a Universal Serial Bus (USB) connector, an exploration tool interface, such as a receiver, and signal processing circuitry which provides the software to the computing device along with the measurements obtained from the exploration tool interface.

Some embodiments include methods of measuring interference in different frequency bands while a VR system is in use. While the VR system is being used, a transmitter of the VR system transmits electromagnetic fields at a first set of frequencies. The receiving devices obtain measurements of electromagnetic fields at the first set of frequencies and at a second set of frequencies different from the first set. The measurements of electromagnetic fields at the first set of frequencies are used to determine locations of the receiving devices for use in the VR system. The measurements of electromagnetic fields at the second set of frequencies are used to determine levels of interference at the second set of frequencies. If the level of interference at the second set of frequencies is below a threshold value, the transmitter switches to transmitting at the second set of frequencies and the measurements at the second set of frequencies are subsequently used to determine the locations of the receiving devices.

BRIEF DESCRIPTION OF THE DRAWINGS

FIG. 1A is a diagram of an illustrative system and case, in accordance with some embodiments of the disclosure;

FIG. 1B is a diagram depicting a side view of an illustrative system placed on a participant, in accordance with some embodiments of the disclosure;

FIG. 1C are diagrams depicting front and back views of an illustrative system placed on a participant, in accordance with some embodiments of the disclosure;

FIG. 8 depicts examples of graphs that may be displayed in the example interface of FIG. 12 in accordance with some embodiments, in accordance with some embodiments of the disclosure;

DETAILED DESCRIPTION

Figure 1D:
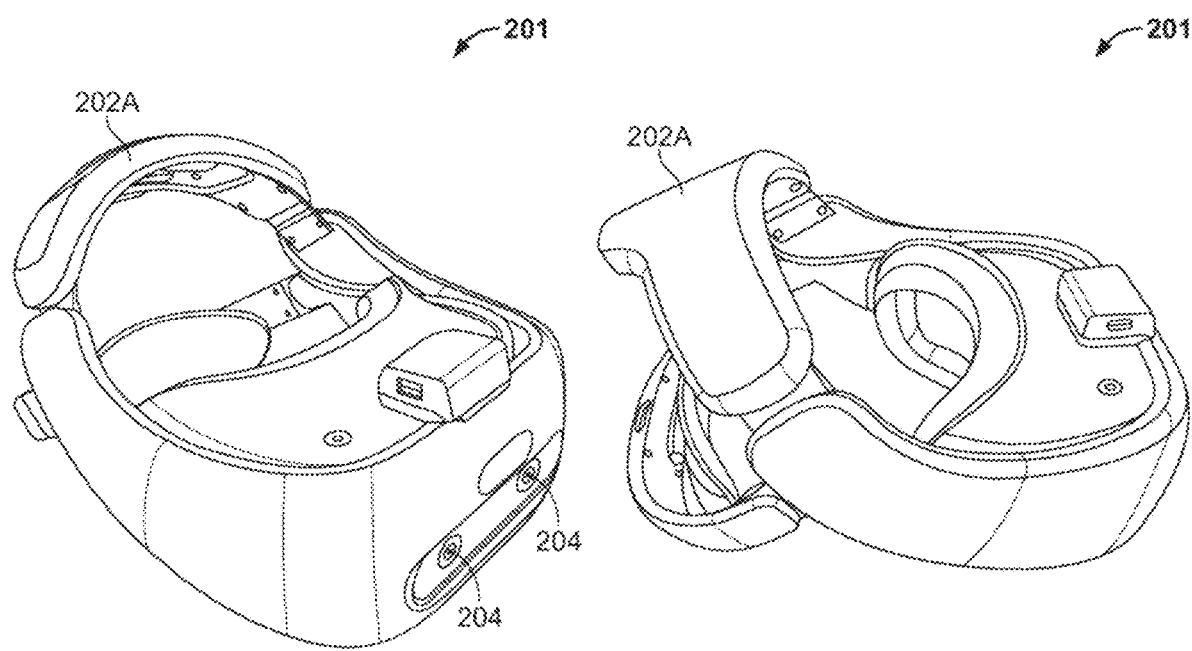
FIG. 1D is a diagram of a head-mounted display of an illustrative system, in accordance with some embodiments of the disclosure.

Obtaining orientation using electromagnetic fields, such as by using AC magnetic trackers, and the processors which determine the position and orientation of such trackers, are well known. One such example, U.S. Pat. No. 4,737,744 ("the '744 patent"), teaches a "method and apparatus for determining remote object orientation and position with an electromagnetic coupling." It shows a transmitter comprising a plurality of radiating antennas, located at a source to provide a plurality of magnetic fields spanning three-dimensional space and defining a source reference coordinate frame, and a receiver comprising a plurality of receiving antennas located on an object to be tracked for receiving that field. A processor receives the outputs from the receiving antennas and converts the received components of the transmitted magnetic fields into remote object position and orientation relative to the source reference coordinate frame. The antennas may be, for example, dipole antennas, loop antennas, or coil antennas.

Many things can affect the accuracy of magnetic tracking systems by impacting the magnetic field between the transmitter and receiver of a system. Objects containing ferrous materials can create distortions in the magnetic fields. Additionally, objects that use electricity will often produce their own electromagnetic fields that can interfere with measurements of electromagnetic fields from a receiver.

In accordance with some embodiments of the disclosure, a measurement device is used to measure interference and/or distortion in an environment where a VR system is planned to be used. The measurement device comprises a transmitter and a receiver attached to a rigid body such that a position and orientation of the receiver with respect to the transmitter is fixed.

When measuring interference, the receiver begins measuring electromagnetic waves with the transmitter powered off. As the measurement device is moved through an environment, the receiver transmits the measurements to a display device, such as through an auxiliary device communicatively coupled to the display device, where the measurements are displayed. As the measurement device is moved through the environment, the measurements are displayed in real-time as interference, thereby allowing a user to identify locations with low interference or identifying sources of interference.

When measuring distortion, the receiver begins measuring electromagnetic waves with the transmitter transmitting electromagnetic waves at the same frequency being measured by the receiver. As the measurement device is moved through an environment, the receiver transmits the measurements to a display device, such as through an auxiliary device communicatively coupled to the display device, where the measurements are displayed. The measurement device or auxiliary device determines distortion using a computed difference between the measured electromagnetic waves and expected measurements of the electromagnetic waves based on the fixed position and orientation of the receiver relative to the transmitter and the output of the transmitter. As the measurement device is moved through the environment, the computed distortion is displayed in real-time, thereby allowing a user to identify locations with low distortion or identifying sources of distortion.

In some embodiments, the measuring device further comprises an accelerometer or other kinematic sensor which detects a particular movement, such as a 90-degree rotation of the device. In response to the detected movement, the measuring device switches from interference measurements to distortion measurements or vice versa. Switching from interference measurement to distortion measurement may comprise causing the transmitter to begin transmitting electromagnetic waves, generating computations of distortion, and/or causing the display device to switch between displaying interference graphs for displaying distortion graphs. Similarly, switch from distortion measurement to interference measurements may comprise causing the transmitter to stop transmitting electromagnetic waves and/or causing the display device to switch between display distortion graphs for displaying interference graphs.

Additional embodiments may include functionality for storing data entries comprising timestamped interference and/or distortion measurements at the auxiliary device. The data entries may further be stored with data comprising input notes to be associated with specific timestamps and/or measurements or photographs to be associated with specific timestamps or measurements.

Additional embodiments of the display may include indicators of a threshold for distortion and/or interference, thereby allowing a user to see at a glance whether the captured measurements are low enough in interference and distortion for a location to be usable to set up a virtual reality device. The display may additional include other captured data, such as dropped packets or received signal strength indicators.

Although references are made to virtual reality, the embodiments of the present disclosure may also be suitable for augmented reality, mixed reality, and assisted reality systems.

FIG. 1A is a diagram of an illustrative system and case, in accordance with some embodiments of the disclosure. For instance, A VR system may include a clinician tablet 210, head-mounted display (HMD or headset) 201, sensors 202, large sensor 202B, charging dock 220, a router, a router battery, headset controller, power cords, and USB cables.

The clinician tablet 210 may be configured to use a touch screen, a power/lock button that turns the component on or off, and a charger/accessory port, e.g., USB-C. For instance, pressing the power button may power on tablet or restart tablet. Once powered on, a clinician may access a user interface and be able to log in, add or select a patient, initialize and sync sensors, select, start, modify, or end a therapy session, view data, and log out.

A headset 201 may contain a power button that turns the component on or off, as well as a charger/accessory port, e.g., USB-C. The headset also provides visual feedback of virtual reality applications in concert with the clinician tablet and the small and large sensors. HMD 201 may include one or more sensors 202A. HMD 201 may include a wireless receiver, e.g., positioned on or near the headset sensor 202A, configured to receive position and orientation data from sensors 202, 202B transmitted wirelessly via, e.g., 2.4 GHz radio frequency. For instance, each sensor may communicate, via radio frequency, its position and orientation to the HMD receiver every few milliseconds.

Charging headset 201 may be performed by plugging a headset power cord into the storage dock 220 or an outlet. To turn on headset or restart headset, the power button may be pressed. A power button may be on top of the headset. Some embodiments may include a headset controller used to access system settings. For instance, a headset controller may only be used in certain troubleshooting and administrative tasks and not during patient therapy. Buttons on the controller may be used to control power, connect to headset, access settings, or control volume.

The large sensor 202B and small sensors 202 are equipped with mechanical and electrical components that measure position and orientation in physical space and then translate that information to construct a virtual environment. In some embodiments, wearable sensors 202 may be comprised of electromagnetic receivers and emitters, one or more optical elements, infrared emitters, accelerometers, magnetometers, gyroscopes, or a combination thereof. In some embodiments, the processor receives tracking data from both electromagnetic sensors and one or more cameras. In some embodiments, the wearable sensors 202 are wireless and communicate with the HMD and/or other components via radio frequency.

For instance, a VR system may comprise one or more electromagnetic emitters and one or more electromagnetic sensors configured to be selectively placed on one or more tracked body parts. Using processing circuitry in communication with the sensors, emitters, and a visual display such as HMD 201, the processing circuitry is configured to receive tracking data from one or more electromagnetic emitters 202B and the one or more electromagnetic sensors 202, and to generate complementary display data comprising an avatar moving according to sensor data. HMD 201 may include a wireless receiver, positioned on or near the headset sensor 202A, configured to receive position and orientation data from sensors 202, 202B wirelessly via radio frequency. In some embodiments, wireless communications may utilize an integrated low-power RF system-on-a-chip and/or a 2.4-GHz RF protocol stack. For instance, each sensor 202 (and WTM 202B) may communicate, via radio frequency, its position and orientation to the HMD receiver every few milliseconds, e.g., 4 ms.

Sensors are turned off and charged when placed in charging station 220. Sensors turn on and attempt to sync when removed from the charging station. The charging station 220 acts as a dock to store and charge the sensors 202, 202B, tablet 210 and/or headset 201. In some embodiments, sensors 202 may be placed in sensor bands 205 on a patient. Sensor bands 205 may be required for use and are provided separately for each patient for hygienic purposes. In some embodiments, sensors may be miniaturized and may be placed, mounted, fastened, or pasted directly onto the user.

As shown in illustrative FIG. 1A, various systems disclosed herein consist of a set of position and orientation sensors that are worn by a VR participant, in this example, a patient. These sensors communicate with a head-mounted display (HMD) 201, which immerses the patient in a VR experience. An HMD suitable for VR often comprises one or more displays to enable stereoscopic three-dimensional ("3D") images. Such internal displays are typically high-resolution (e.g., 2880×1600 or better) and offer high refresh rate (e.g., 75 Hz). The displays are configured to present three dimensional images to the patient. VR headsets typically include speakers and microphones for deeper immersion.

An HMD is a central piece to immersing a patient in a virtual world in terms of presentation and movement. A headset may allow, for instance, a wide field of view (e.g., 110°) and tracking along six degrees of freedom. The HMD headset may include cameras, accelerometers, gyroscopes, and proximity sensors. VR headsets typically include a processor, usually in the form of a system on a chip (SoC), and memory. Headsets may also use, for example, additional cameras as safety features to helps users avoid real-world obstacles. An HMD will typically comprise more than one connectivity options in order to communicate with the therapist's tablet. For instance, an HMD may use an SoC that features Wi-Fi, Bluetooth, and/or other radio frequency connectivity, in addition to an available USB connection (e.g., USB Type-C). The USB-C connection may also be used to charge the built-in rechargeable battery for the headset.

The healthcare provider may use a tablet, e.g., tablet 210 depicted in FIG. 1A, to control the patient's experience. The tablet runs an application and communicates with a router to cloud software configured to authenticate users and store information. Tablet 210 may communicate with HMD 201 in order to initiate HMD applications, collect relayed sensor data, and update records on the cloud servers. Tablet 210 may be stored in the portable container and plugged in to charge, e.g., via a USB plug.

FIG. 1B is a diagram depicting a side view of an illustrative system placed on a participant, in accordance with some embodiments of the disclosure. FIG. 1C are diagrams depicting front and back views of an illustrative system placed on a participant, in accordance with some embodiments of the disclosure. In some embodiments, such as depicted in FIGS. 1B-C, sensors 202 are placed on the body in particular places to measure body movement and relay the measurements for translation and animation of a VR avatar. Sensors 202 may be strapped to a body via bands 205. In some embodiments, each patient may have her own set of bands 205 to minimize hygiene issues.

A wireless transmitter module 202B (WTM) may be worn on a sensor band 205B that is laid over the patient's shoulders. WTM 202B sits between the patient's shoulders on their back. In some embodiments, WTM 202B includes a sensor. In some embodiments, WTM 202B transmits its position data in relation to one or more sensors and/or the HMD. In some embodiments, WTM 202B may emit an electromagnetic field (EMF) and sensors 202 are wearable electromagnetic (EM) sensors. For example, wearable sensor 202 may include an EM receiver and a wireless transmitter.

Each sensor 202 may learn its relative position and orientation to the WTM, e.g., via calibration. Sensors 202 with EM receivers in an EMF may provide precise position and orientation tracking with fidelity and precision down to, e.g., the nearest 1 mm (position) and degree (orientation). In some embodiments, wearable sensor 202 may use EMF and inertial measurement. Wireless sensor modules 202 (e.g., sensors or WSMs) are worn just above each elbow, strapped to the back of each hand, and on a pelvis band that positions a sensor adjacent to the patient's sacrum on their back. Wearable sensors 202 may include a light indicating charge status, such as blue or green for charged or charging and red for charge needed. Wearable sensors 202 may be wireless, small, and nonintrusive as illustrated in FIGS. 2A-2E. In some embodiments, each WSM communicates its position and orientation data in real-time to an HMD Accessory (e.g., HMD receiver) located on the HMD.

FIG. 1D is a diagram of a head-mounted display of an illustrative system, in accordance with some embodiments of the disclosure. The HMD Accessory may include a sensor 202A that may allow it to learn its position and orientation relative to WTM 202B. The HMD Accessory may include a wireless receiver which allows the HMD to know where in physical space all the WSMs and WTM are located. The HMD Accessory and receiver may utilize an integrated low-power RF system-on-a-chip and/or a 2.4-GHz RF protocol stack to communicate wirelessly. In some embodiments, each of sensors 202, 202B communicates independently with the HMD Accessory which then transmits its data to the HMD, e.g., via a USB-C connection. In some embodiments, each sensor 202 learns its position and orientation (P&O) based on the EMF emitted by WTM 202B (and other sensor data) and each sensor 202 wirelessly communicates the P&O data with HMD 201, e.g., via radio frequency.

Figure 2:
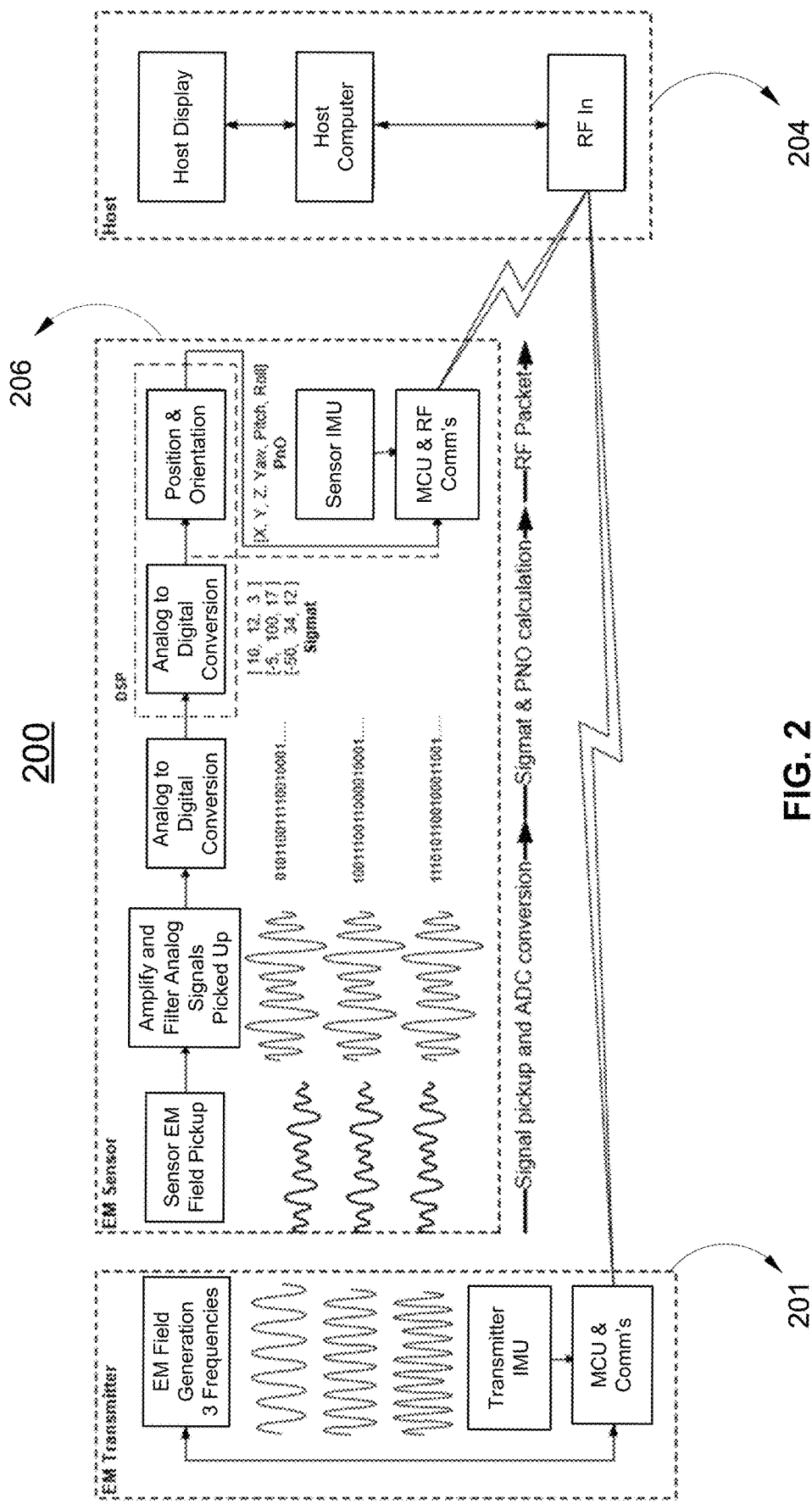
FIG. 2 is a diagram to show alternating current (AC) based wireless EM tracking system, in accordance with some embodiments of the disclosure.

FIG. 2 is a diagram to show AC based wireless EM tracking system. EM Transmitter 211 contains three-axis transmitter coils and the EM sensor 216 is a receiver that contains three-axis sensor coils, in accordance with some embodiments of the disclosure. The EM transmitter 211 generates EM fields and transmits them to the host 214. The EM transmitter also contains an IMU which can take measurements of its movements. The EM sensor 216 contains circuitry for EM field pickup to sense the transmitted EM fields from the transmitter. In some embodiments, these received EM fields may be amplified and/or filtered and then converted from analogue to digital signals by circuitry in the EM sensor 216. In some embodiments, a digital signal processor (DSP) may implement a Fourier transform to generate the signal matrix and convert it to position and orientation information. In some embodiments, these steps may be complete at the host 214. The EM sensor 216 also contains circuitry for transmitting any of the signal matrix, position and orientation information, or sensor IMU data to the host or any other device. The host computer may receive fields from the transmitter or receiver and implement any step of calculations of the position and orientation information in the computer. This can be used to generate information for a display at the host computer. The display may be a display in the HMD or any other display.

Examples of head-mounted display systems in accordance with embodiments may be found in application Ser. No. 17/394,558, the entire contents of which are incorporated by reference as if fully set forth herein.

Figure 3:
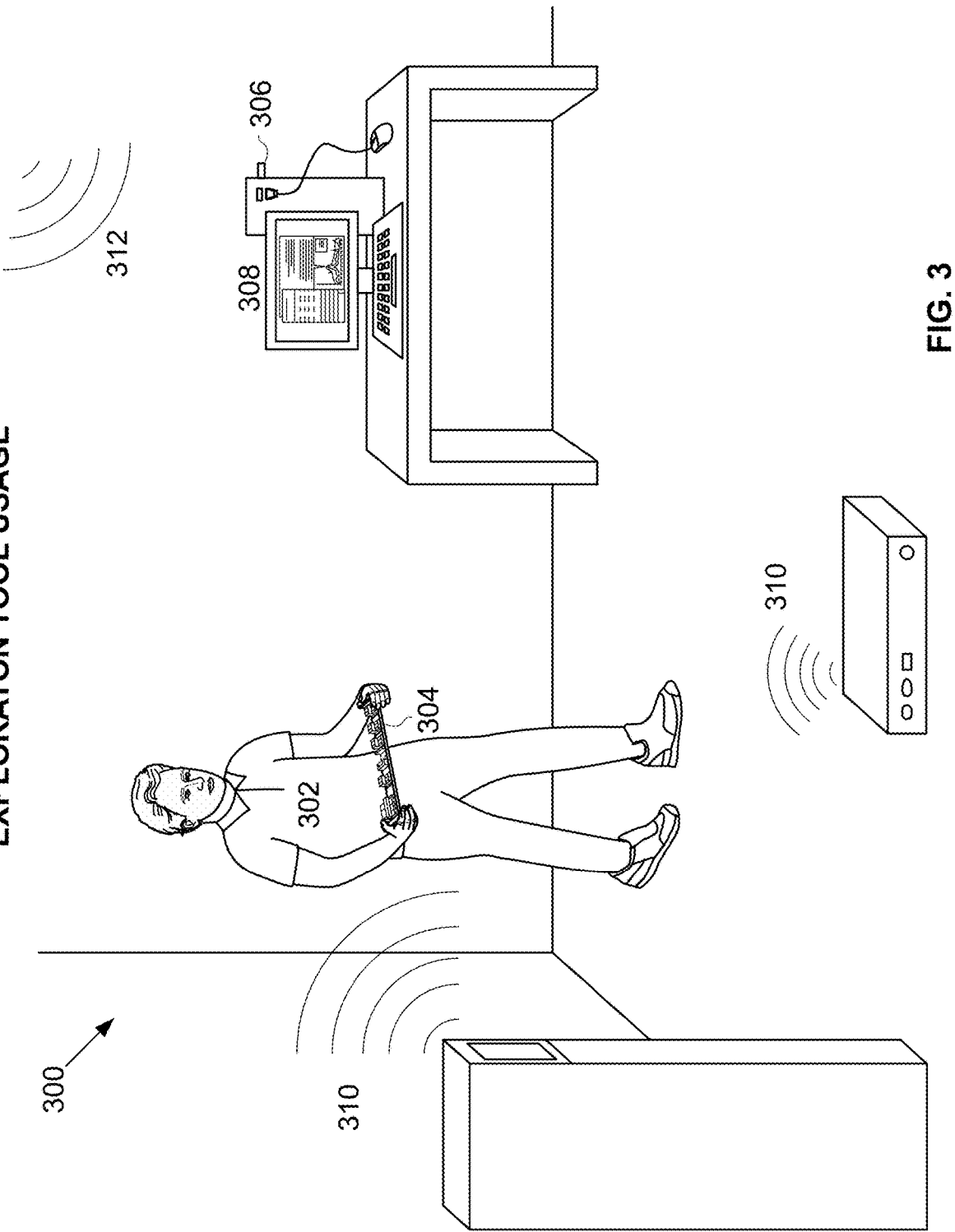
FIG. 3 depicts an example implementation of using a measurement device to measure distortion and/or interference in an environment, in accordance with some embodiments of the disclosure.

FIG. 3 depicts an example implementation of using a measurement to measure distortion and/or interference in an environment. Environment 300 comprises a physical environment being evaluated for distortion and/or interference. For example, environment 300 may comprise a location where a virtual reality system that utilizes electromagnetic waves to identify locations of sensors is to be set up.

A person 302 may use measurement device 304 to obtain measurements of electromagnetic waves as measurement device 304 is moved through environment 300. Measurements of electromagnetic waves are transmitted from measurement device 304 to auxiliary device 306 over one or more frequencies. Auxiliary device 306 provides the measurements of electromagnetic waves to display device 308 which displays the measurements through a graphical user interface.

The measurement device 304 may be configured to obtain measurements of interference and/or distortion using the methods described further herein. Distortion 312 is caused by metal in the magnetic field and often has a broad range of effect. In contrast, interference 310 often is caused by an identifiable object in the environment. The measurement device 304 may be used to identify an object that causes the source of interference. For instance, as measurement device 304 is moved through environment 300, display device 308 may continuously update measurements of interference. Based on updated interference measurements, person 302 may identify which directions cause the measurements of electromagnetic waves to increase or decrease, thereby allowing person 302 to move measurement device 304 closer to the object that causes interference 310. When an object is identified, the object may be removed. If the object is unable to be moved or removed, a location further from the object may be selected for setting up the virtual reality system. In some embodiments, a camera may be used to capture an image of the object which can then be stored with data identifying the measurements of electromagnetic waves that were captured from the measurement device 304 when the image was captured.

In some embodiments, the display device 308 displays indications as to whether interference or distortion in a given location is below a threshold level. For example, display device 308 may display distortion or interference levels based on measurements received from measurement device 304 through auxiliary device 306. Display device 308 may additionally display a threshold value for distortion or interference levels and an indication as to whether the measured distortion or interference levels are below the threshold value. Person 302 may move measurement device 304 through environment 300 to identify locations where interference or distortion levels are below the threshold value or values.

Figure 4:
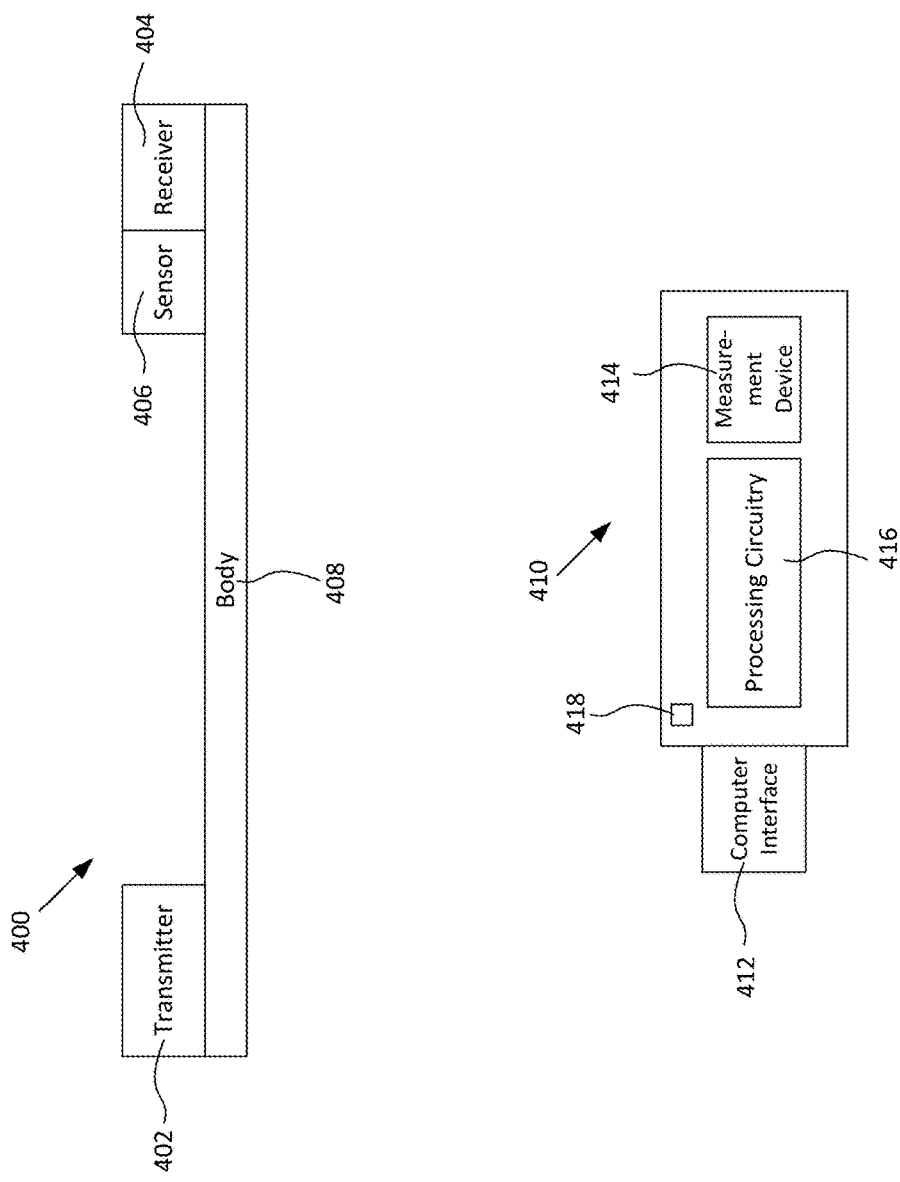
FIG. 4 depicts an example measurement device and auxiliary device according to some embodiments, in accordance with some embodiments of the disclosure.

FIG. 4 depicts an example measurement device and auxiliary device according to some embodiments. Measurement device 400 comprises transmitter 402, receiver(s) 404, and movement sensor 406 attached to rigid body 408. Transmitter 402 comprises a device configured to transmit electromagnetic waves, such as the WTM of FIG. 2. Receiver(s) 404 comprise one or more devices configured to receive and process electromagnetic waves through an antenna and processing circuitry to compute a magnitude of electromagnetism over one or more frequencies, such as the WSMs of FIG. 2. In some embodiments, receiver(s) 404 comprise three receivers oriented to capture and process electromagnetic waves in three perpendicular planes. Movement sensor 406 comprises a sensor configured to detect movement, such as accelerometer or gyroscope, configured to detect movement of the rigid body.

Rigid body 408 comprises a rigid material, such as wood or metal, which fixes a position and orientation of transmitter 402 and receiver(s) 404 with respect to each other. Movement and/or rotation of rigid body 408 thus causes movement and/or rotation of both the transmitter 402 and receiver(s) 404 without affecting a position and orientation of receiver(s) 404 relative to transmitter 402, thereby allowing the position and orientation of receiver(s) 404 relative to transmitter 402 to be a known and unchanging value. The measurement device 400 of FIG. 4 provides on example of a measurement device according to some embodiments and other embodiments may include more or less elements. For example, a measurement device may include the transmitter 402 and receiver(s) 404 without the accelerometer. Additionally or alternatively, a measurement device may include a different means of providing input to begin providing measurements and/or to switch from interference measurement to distortion measurement, such as through a switch.

Auxiliary device 410 comprises computer interface 412, measurement device interface 414, signal processing circuitry 416, and connection LEDs 418. Computer interface 412 comprises an interface by which auxiliary device 410 may be connected to a computing device through a direct or wireless connection, such as a universal serial bus (USB) connector or a Bluetooth transmitter. Measurement device interface 414 comprises one or more receivers configured to communicate with measurement device 400. For example, receiver(s) 404 may be coupled to one or more additional transmitters which transmit data captured by receiver(s) 404 over one or more frequencies. Measurement device interface 414 may comprise one or more receivers configured to capture the data transmitted by receiver(s) 404. Processing circuitry 416 comprises circuitry based on one or more microprocessors, microcontrollers, digital signal processors, programmable logic devices, field-programmable gate arrays (FPGAs), application-specific integrated circuits (ASICs), etc., and may include a multi-core processor (e.g., quad-core). Processing circuitry 416 may be configured to process signals received through measurement device interface 414 and convert the processed signals into data which is displayed through the computing device. Connection LEDs 418 comprise one or more light emitting diodes (LED) which are configured to light up when the computer interface 412 is interfacing with a computing device and measurement device interface 414 is receiving data from the measurement device.

Figure 5:
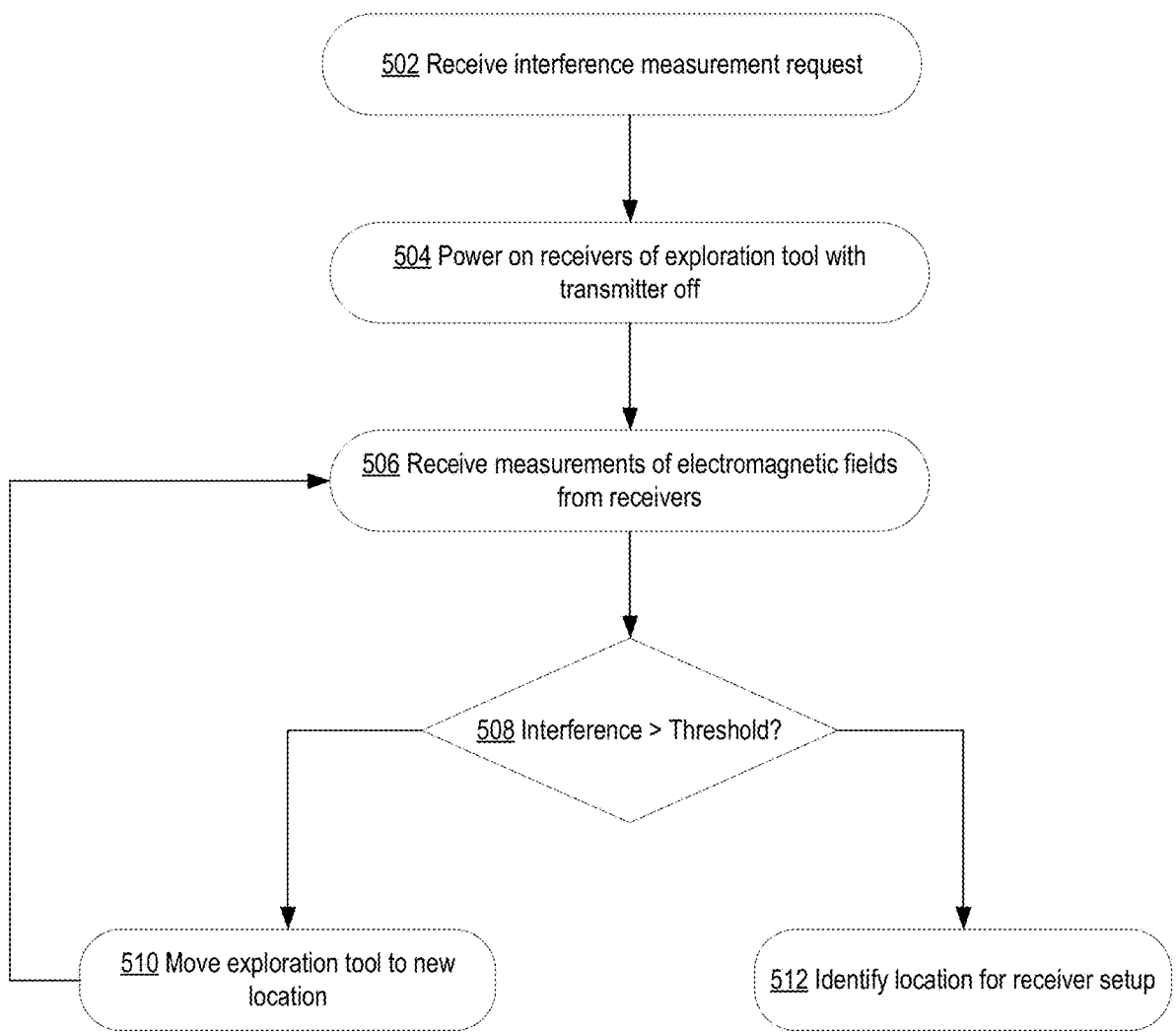
FIG. 5 depicts a flowchart of an example method for identifying locations to setup a VR system using a measurement device, in accordance with some embodiments of the disclosure.

FIG. 5 depicts a flowchart of an example method for identifying locations to setup a VR system using a measurement device. The methods described in the flowcharts of FIGS. 5 and 6 may be performed using, e.g., the measurement device and auxiliary device described with respect to FIG. 4.

At step 502, an interference measurement request is received by a measurement system comprising a measurement device and a computing device. The interference measurement request may comprise input turning on a measurement device and/or input switching a mode of the measurement device as described further herein. In some embodiments, the input is received at a computing device and transmitted to the measurement device through a measurement device interface on an auxiliary device.

At step 504, the receivers of an exploration tool are powered on with the transmitter powered off. If the measurement device is in a distortion measurement mode when the request is received, the measurement device may cease transmitting electromagnetic fields from the transmitter and continue obtaining measurements of magnetic fields from the receivers. If the measurement device is powered off when the request is received, the measurement device may power on the receivers without powering on the transmitter.

At step 506, with the transmitter powered off, the computing device receives measurements of electromagnetic fields from the receivers. For example, the receivers of the measurement device may continually or periodically obtain measurements of electromagnetic waves over a plurality of frequencies. A transmitter of the receivers may transmit a signal identifying the measurements over one or more frequencies. In some embodiments, the measured frequencies overlap with the transmission frequency. For example, the receivers may be configured to measure electromagnetic waves over a range of frequencies with the frequency used to transmit the signal comprising a frequency within the range.

The computing device may display measurements of the electromagnetic waves as interference measurements as the measurement device is moved through the environment. Thus, interference measurements may be displayed in real-time such that a user can determine, by looking at the display, a level of interference in the location where the measurement device is being held.

At step 508, a determination is made as to whether the interference is greater than a threshold value. For example, the computing device may display the interference measurements with data identifying the threshold, such as a line in a graph or a threshold value. The determination as to whether the interference is greater than the threshold value may be made by the user or the computing device. For example, the user may determine whether bars indicating interference measurements are below the line in the graph. As another example, the computing device may determine whether the interference measurements are greater or lower than the threshold value and display an indication, such as a red light if the measurements are greater than threshold value and a green light if the measurements are below the threshold value.

At step 510, if the interference is greater than the threshold value, the exploration tool is moved to a new location and the process returns to step 506. For example, the user may continue to move the measurement device through the environment until the measurements of interference are below the threshold value. Thus, when the interference measurements are greater than the threshold value, the exploration tool is moved to a new location, the measurements are transmitted to the computing system, and a new determination is made as to whether the measurements are greater than the threshold value.

At step 512, if the interference is not greater than the threshold value, the location is identified as a location for setting up the receiver. For example, the user may identify a location with interference below the threshold as a location for setting up a VR headset comprising a transmitter and a receiver. In some embodiments, the location is additionally evaluated for distortion to determine whether to set up the VR headset in the location. The evaluation of distortion may occur prior to the evaluation of interference, after the evaluation of interference, or interspersed with evaluations of interference. For instance, if the interference in a location is below a threshold value, the user may switch the mode of the measurement device to measure distortion. If the distortion is above a threshold, the user may move the measurement device to new locations until a location is identified with distortion below the threshold. The user may then switch the mode of the measurement device to measure interference. The user may repeat this process until a location is identified with both distortion and interference below the threshold value.

Figure 6:
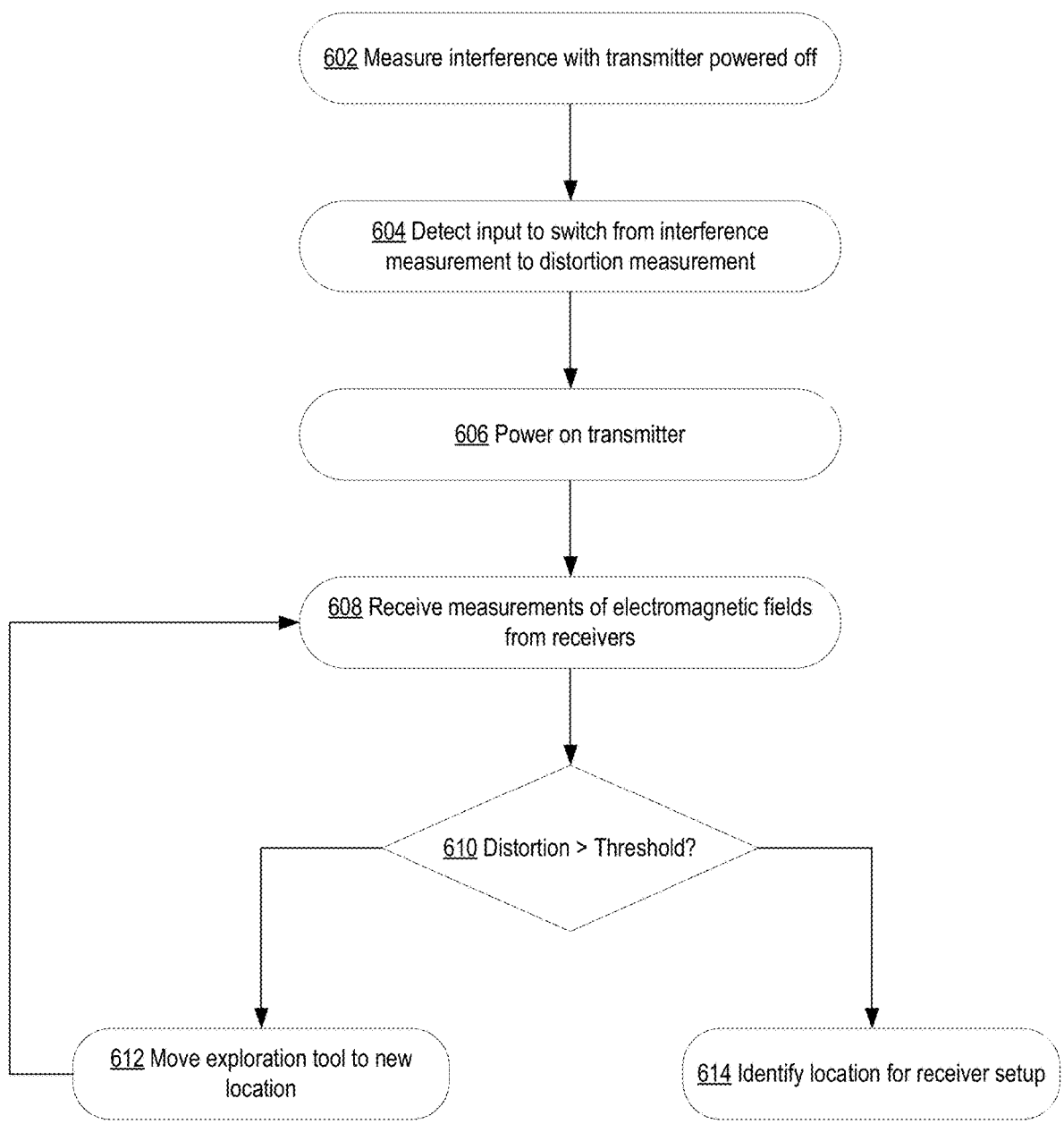
FIG. 6 depicts a flowchart of an example method for measuring distortion, in accordance with some embodiments of the disclosure.

FIG. 6 depicts a flowchart of an example method for measuring distortion. While FIG. 6 depicts a switch from measuring interference to measuring distortion, some embodiments may initialize with the measurement of distortion and use the same methods to switch to measuring interference. Additionally, the measurement device may switch back and forth between measuring interference and measuring distortion.

At step 602, the measurement system measures interference in the VR environment with the transmitter powered off. For example, the measurement system may measure electromagnetic waves with the transmitted of the measurement device powered off, or otherwise not transmitting electromagnetic waves, using the methods described in FIG. 5 with the measurements transmitted to a computing device.

At step 604, the measurement system detects input to switch from interference measurement to distortion measurement. The input to switch from interference measurement to distortion measurement may comprise input received at a computing device that is transmitted to the measurement device, input receiver through a button or switch of the measurement device, or a detected action. For example, the measurement system may detect a rotation of the measurement device by the accelerometer of the measurement system. When the measurement system is rotated from one orientation to a second orientation, such as a ninety-degree rotation, the measurement system may switch from interference measurement to distortion measurement and/or vice versa.

At step 606, the measurement system powers on the transmitter of the measurement device. For example, the transmitter of the measurement device may begin transmitting electromagnetic waves in response to the detection of the input to switch from interference measurement to distortion measurement. Conversely, if the measurement system detects input to switch from distortion measurement to interference measurement, the measurement system may cause the transmitter to stop transmitting electromagnetic waves.

With the transmitter powered on, the receivers may measure the electromagnetic waves in the frequency transmitted by the transmitter. Given that the measurement system has access to data defining the initial power at which the electromagnetic waves are transmitted, the measurement system can compute the position and orientation of the receivers with respect to the transmitter. As the transmitter and receivers are connected to a rigid body, the position and orientation of the receivers with respect to the transmitter is a fixed value. Thus, the difference between the computed position and orientation of the receivers with respect to the transmitter and a stored value indicating a known position and orientation of the receivers with respect to the transmitter may be computed to determine the level of distortion in the area. Computing the level of distortion may comprise computing a squared difference or average squared difference between two values indicative of relative position and orientation and then computing, based on the squared difference, an intensity of electromagnetism that would cause the squared difference.

At step 608, a determination is made as to whether the distortion is greater than a threshold value. For example, the computing device may display the distortion measurements with data identifying the threshold, such as a line in a graph or a threshold value. The determination as to whether the distortion is greater than the threshold value may be made by the user or the computing device. For example, the user may determine whether bars indicating distortion measurements are below the line in the graph. As another example, the computing device may determine whether the distortion measurements are greater or lower than the threshold value and display an indication, such as a red light if the measurements are greater than threshold value and a green light if the measurements are below the threshold value.

At step 610, if the distortion is greater than the threshold value, the exploration tool is moved to a new location and the process returns to step 606. For example, the user may continue to move the measurement device through the environment until the measurements of distortion are below the threshold value. Thus, when the distortion measurements are greater than the threshold value, the exploration tool is moved to a new location, the measurements are transmitted to the computing system, and a new determination is made as to whether the measurements are greater than the threshold value.

At step 612, if the distortion is not greater than the threshold value, the location is identified as a location for setting up the receiver. For example, the user may identify a location with distortion below the threshold as a location for setting up a VR headset comprising a transmitter and a receiver. In some embodiments, the location is additionally evaluated for interference to determine whether to set up the VR headset in the location. The evaluation of interference may occur prior to the evaluation of distortion, after the evaluation of distortion, or interspersed with evaluations of distortion. For instance, if the distortion in a location is below a threshold value, the user may switch the mode of the measurement device to measure interference. If the interference is above a threshold, the user may move the measurement device to new locations until a location is identified with interference below the threshold. The user may then switch the mode of the measurement device to measure distortion. The user may repeat this process until a location is identified with both distortion and interference below the threshold value.

FIGS. 5 and 6 depict methods of using the measurement system to determine locations to set up a VR system. Additional uses of the measurement system may include identifying causes of interference or distortion, generating correction data based on interference or distortion measurements, mapping interference or distortion measurements to locations in an environment, mapping interference or distortion measurements to input data, or mapping interference or distortion measurements to images. In some embodiments, the measurement system stores a plurality of data records, each of which including a measurement of interference or distortion and a timestamp corresponding to the measurement.

Causes of interference or distortion may be identified by moving the measurement device through the environment to identify where the interference or distortion is greatest. As the intensity of electromagnetic waves drop off by the square of the distance from the source, the closer the measurement device gets to the source of the interference or distortion, the higher the measurements will be. When an item is identified, the item may be moved, powered off, shielded, or otherwise altered to reduce the effect of interference or distortion from the item.

Correction data may be generated when interference or distortion measurements are relatively stable for a location. For instance, if the location where the VR system is to be set up has a stable amount of distortion, the system may store data defining the stable amount of distortion and may reduce future measurements by the stored value. Additionally, or alternatively, if a source of interference or distortion is known the system may compute the effect of interference or distortion on an area surrounding the VR system and may use said data to reduce measurements of interference or distortion for the location of the VR system.

Interference or distortion data may additionally be mapped to an environment. For example, as the measurement device moves through an environment, the measurement system may additionally capture data defining a location of the measurement device, such as through GPS, electromagnetic tracking in a channel with low interference or distortion, or other methods of tracking the measurement device in three-dimensional space. The measurement system may store a plurality of data records, each of which including a measurement of interference or distortion and a corresponding location in the environment. The mapped measurements may be used in additional research and development and/or to created correction data based on known sources of interference or distortion.

Interference or distortion data may additionally be mapped to input data. For example, a graphical user interface displayed on the display device may include an option for entering notes. Upon selection of the option and input into a notes field, the notes may be stored in association with one or more measurements of interference or distortion, such as in a data record that includes the measurements or a timestamp of the measurements. The measurements associated with the note may be selected through the graphical user interface and/or measurements that were captured when the note was created.

Interference or distortion data may additionally be mapped to one or more images. For example, a graphical user interface displayed on the display device may include an option for capturing and/or uploading an image. The image may be captured from a camera on the measurement device and/or from a separate device. Upon selection of the option the providing of the image, the image may be stored in association with one or more measurements of interference or distortion, such as in a data record that includes the measurements or a timestamp of the measurements. The measurements associated with the image may be selected through the graphical user interface and/or measurements that were captured when the image was taken.

Figure 7:
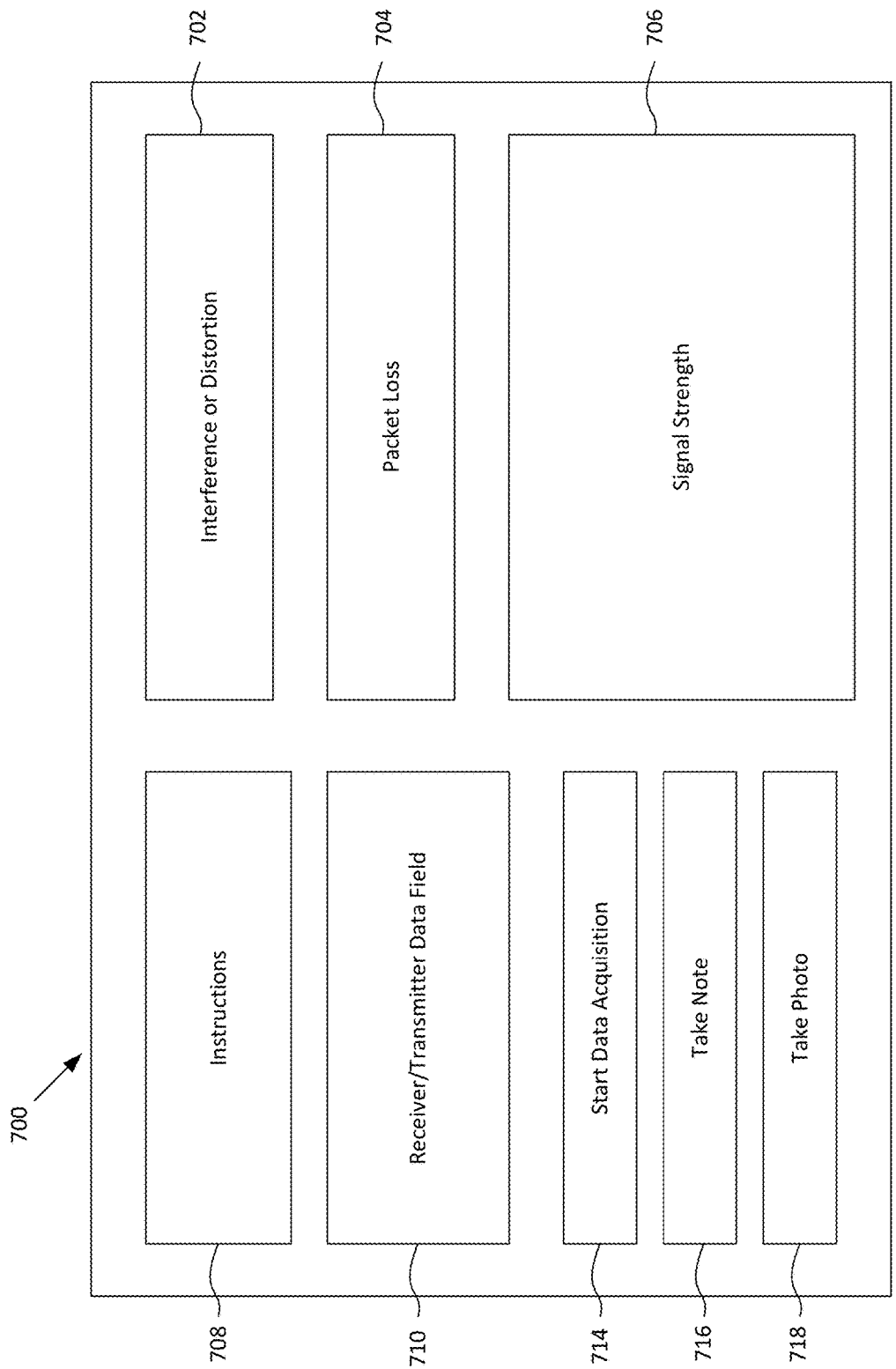
FIG. 7 depicts an example interface for a measurement system in accordance with some embodiments, in accordance with some embodiments of the disclosure.

FIG. 7 depicts an example interface for a measurement system in accordance with some embodiments. Interface 700 includes interference or distortion graphs 702, packet loss graph 704, received signal strength indicator (RSSI) graph 706, instructions 708, receiver or transmitter data field 710, initiation option 714, notes option 716, and image capture option 718.

Interference or distortion graphs 702 comprise one or more graphs of interference or distortion based on measurements captured from the measurement device. The interference or distortion graphs 702 may be updated in real-time as the measurement device is moved through the environment. Examples of interference or distortion graphs 702 are depicted in FIG. 8.

Packet loss graph 704 comprises a graph depicting packet loss of transmissions from the measurement device to the display device. For example, the measurement device may be configured to send a set number of packets of data with each transmission and/or over a set period of time. Based on the number of packets of data received from the measurement device at the auxiliary device, the measurement system may determine a number of dropped packets over time and may display the number of dropped packets over time in a graph that updates in real-time as new data is received.

RSSI statistics graph 706 comprises a graph of signal strength detected by the auxiliary device and/or by the receivers of the measurement device. The RSSI statistics may include signal strength statistics generally and/or specific statistics for individual channels, such as a channel over which the measurement device is transmitting data.

Instructions 708 comprise text or images displayed through the graphical user interface which explains how to use the measurement device. Instructions 708 may indicate how to turn on the measurement device, switch measurement modes, correlate measurements to notes or images, or otherwise move the measurement device through the environment. In some embodiments, instructions 708 update as actions are taken. For example, when the measurement device is moving through the environment detecting interference, the instructions may explain how to find a spot with low interference. When interference below a threshold is identified, the instructions may update to explain how to switch from measuring interference to measuring distortion.

Receiver or transmitter data field 710 comprises text or images displayed through the graphical user interface which includes information about the receivers and/or transmitter. Examples of data displayed in receiver or transmitter field 710 include type of device, serial number of the device, the number of packets that were dropped within the last frame of dropped packets over the number of expected dropped packets, and/or the latest distortion measurement, in millimeters, on that device.

Initiation option 714 comprises a selectable option which, when selected, causes the measurement system to begin storing distortion or interference data. In some embodiments, selection of initiation option 714 causes the receivers to begin capturing measurements of electromagnetic waves and transmitting them to the auxiliary device. In other embodiments, selection of the initiation option causes the auxiliary device to begin storing measurements of electromagnetic waves in data records, such as in an excel spreadsheet, where the measurements were previously only being displayed.

Notes option 716 comprises a selectable option which, when selected, causes the display device to display a field for inputting notes to be stored in association with measurement data. The display device may additionally include options for specifying previous data records to associate with the entered notes and/or options for starting an acquisition of new measurements to associate with entered notes. As a practical example, if a device in the environment has two modes—an active mode and a standby mode—a use may wish to capture measurements in a particular location when the device is in each mode. Thus, the user may set the device to standby mode, capture interference measurements, and enter a note into the notes field indicating that the device was in standby mode. The user may then set the device to active mode, capture interference measurements, and enter a note into the notes field indicating that the device was in active mode.

Image capture option 718 comprises a selectable option which, when selected, provides an option to capture an image through a camera of the measurement system and/or to upload an image captured by a separate camera device to be associated with measurement data. The display device may additionally include options for specifying previous data records to associate with the captured image and/or options for starting an acquisition of new measurements to associate with the captured image. As a practical example, a user may wish to capture an image of a device that is causing high levels of interference. The user may move the measurement device to a location where the interference is high and point a camera of the measurement device or an external camera at the device causing the interference. The user may select the image capture option 718 and capture an image of the device and/or of the measurement device's location while the measurement device is capturing interference measurements. The image may then be stored in a data record which includes the measurements captured when the image was taken.

FIG. 8 depicts examples of graphs that may be displayed in the example interface of FIG. 7 in accordance with some embodiments. Interference or distortion graph 802 comprises a graph of interference or distortion based on measurements from the receivers. In the example of FIG. 8, measurements of interference are depicted for each of four receivers. The number of graphs may change depending on the number of receivers in the measurement device. In some embodiments, the interference or distortion graph additionally includes threshold line 804 which provides a visual indication of a threshold for interference or distortion. Thus, interference or distortion may be determined to be below the threshold when all of the receivers' graphs depict bars below the threshold line 804. In some embodiments, the graph switches from being an interference graph to being a distortion graph based on a mode of the measurement device. In other embodiments, both graphs are displayed simultaneously with the graph that doesn't match a current measurement mode displaying the last measured values prior to a switch in the measurement mode.

Packet loss graph 804 comprises a graph of packet loss based on detected packet loss from each of the receivers. In the example of FIG. 8, the packet loss graph 806 additionally includes packet loss from the transmitter (WTM). In some embodiments, packet loss graph 806 additionally includes threshold line 808 which provides a visual indication of a threshold for packet loss. Thus, packet loss may be determined to be below the threshold when all of the receivers' and the transmitter's graphs depict bars below the threshold line 808.

Figure 9:
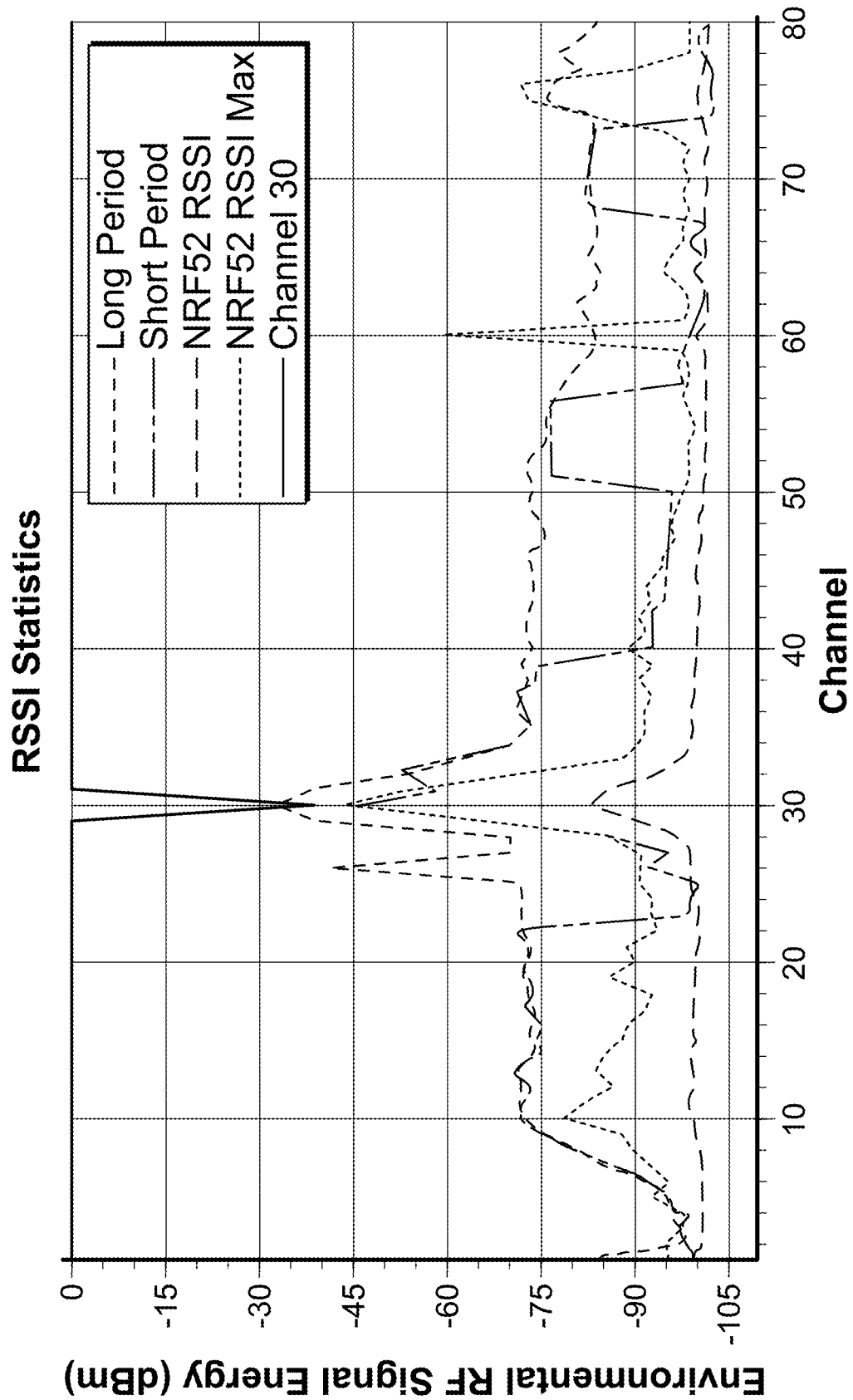
FIG. 9 depicts an example of a received signal strength indicator (RSSI) graph that may be display in the example interface of FIG. 7, in accordance with some embodiments of the disclosure.

FIG. 9 depicts an example of a received signal strength indicator (RSSI) graph that may be display in the example interface of FIG. 7 in accordance with some embodiments. RSSI graph 902 comprises a graph of signal strength across a plurality of channels as detected by the auxiliary device (identified as NRF52 in the RSSI graph of FIG. 9).

Figure 10:
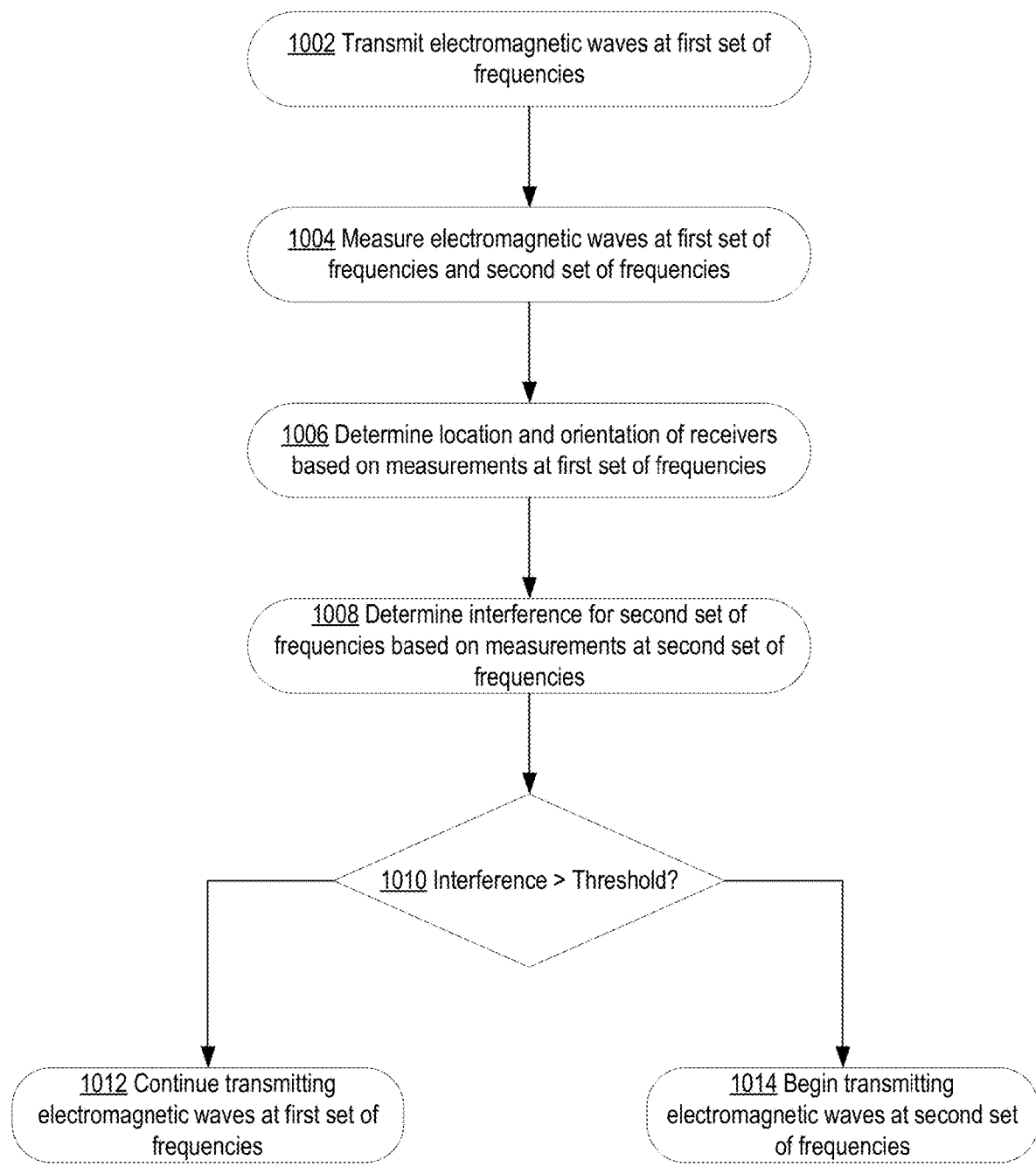
FIG. 10 depicts an example method for measuring and switching frequencies during operation of a VR system, in accordance with some embodiments of the disclosure.

Embodiments previously described use a measuring device to determine interference and or distortion prior to the setup of a VR system. In some embodiments, a VR system uses measurements of interference while the VR system is being used to identify channels for use in the VR system. FIG. 10 depicts an example method for measuring and switching frequencies during operation of a VR system. The method of FIG. 10 may be employed to identify and avoid interference after the VR system has been setup and is operating.

At step 1002, a transmitter of a VR system transmits electromagnetic waves at a first set of frequencies. For example, the VR system may select a starting set of channels for use in determining locations and orientations of receivers. Additionally, or alternatively, the methods described herein may be performed multiple times during a given session. Thus, the set of channels may be channels previously selected by the VR system through application of the method of FIG. 10.

At step 1004, the receivers of the VR system capture measurements of electromagnetic waves at the first set of frequencies and at a second set of frequencies. For example, the VR system may select a set of channels to evaluate for interference. The evaluated channels at the second set of frequencies comprise channels different from the first set of frequencies where the VR system is not transmitting electromagnetic waves from a transmitter. Thus, measurements received at the second set of frequencies comprise measurements of background electromagnetic waves not created by the VR system.

At step 1006, locations and orientations of receivers are determined based on the measurements at the first set of frequencies. For example, the VR system may operate by transmitting the electromagnetic wave to the receivers and determine how the receivers are being moved based on the measurements captured by the receivers. The locations and orientations of the receivers may then be used to generate for display a virtual reality environment with representations corresponding to the receivers depicted in locations in the virtual reality environment based on the determined locations.

At step 1008, while the locations and orientations of receivers are being determined based on the measurements at the first set of frequencies, interference for the second set of frequencies is determined based on the measurements at the second set of frequencies. As the transmitter is not transmitting at the second set of frequencies, any measurements of electromagnetic waves at the second set of frequencies would comprise background interference.

At step 1010, the VR system determines if the interference is greater than a threshold value. For example, the system may store data indicating an expected and/or maximum level of jitter in a location corresponding to the receivers. If the interference is greater than the threshold value, at step 1012, the VR system determines that the interference on the second set of frequencies is too high and continues transmitting magnetic fields from the transmitter at the first set of frequencies. Thus, operation of the VR system remains unchanged as the second set of frequencies is evaluated while the first set of frequencies is being used. In some embodiments, if the interference is greater than the threshold value, the VR system selects another set of frequencies to evaluated and the process begins again.

If the interference is not greater than the threshold value, at step 1014, the transmitter switches to transmitting magnetic fields at the second set of frequencies. Positions and orientations of the receivers may then be determined based on measurements of the magnetic fields by the receivers at the second set of frequencies. In this manner, the VR system evaluates a set of frequencies for interference and, if the interference is low enough, seamlessly switches to using the set of frequencies to track the locations and orientations of receivers.

In some embodiments, the VR system uses the methods described herein to evaluate a set of frequencies currently being used. For example, the VR system using a first set of frequencies may temporarily switch to using a second set of frequencies while the first set of frequencies is evaluated. If the interference over the first set of frequencies is below the threshold, the VR system may switch back to using the first set of frequencies. If the interference over the first set of frequencies is above the threshold, the VR system may continue using the second set of frequencies.

What is claimed is:

1. A method comprising:
    transmitting electromagnetic fields from a transmitter of a measurement device at one or more first frequencies, wherein the measurement device comprises the transmitter affixed to a rigid body and a receiver affixed to the rigid body at a fixed position and orientation relative to the transmitter;
    measuring electromagnetic fields at a receiver of the measurement device at the one or more first frequencies;
    transmitting the measurements of the electromagnetic fields from the receiver to a computing device at one or more second frequencies as the measurement device is moved through an environment;
    receiving a request to determine interference at a current location in the environment and, in response, measuring electromagnetic fields at the one or more first frequencies at the receiver of the measurement device without transmitting the electromagnetic fields from the transmitter of the measurement device;
    detecting an input to switch from interference measurement to distortion measurement at the current location;
    in response to detecting the input to switch, at the current location, transmitting the electromagnetic fields from the transmitter at the one or more first frequencies and the measuring electromagnetic fields at the receiver at the one or more first frequencies; and
    if the distortion is less than a threshold, identifying the current location as usable.

2. The method of claim 1, further comprising:
    computing, based on measurements of electromagnetic fields at the one or more first frequencies, a position and orientation of the receiver relative to the transmitter;
    computing a difference between the computed position and orientation of the receiver relative to the transmitter and a stored value comprising a known position and orientation of the receiver relative to the transmitter based on a length of the rigid body of the measurement device;
    based on the difference, computing a level of distortion in a location of the measurement device.

3. The method of claim 2, further comprising displaying, by a graphical user interface of a computing device, real-time levels of distortion as the measurement device is moved through the environment.

4. The method of claim 3, further comprising displaying, with the real-time levels of distortion, an indication as to whether the distortion is greater than a threshold value.

5. The method of claim 1, further comprising displaying, by a graphical user interface of a computing device, real-time levels of interference as the measurement device is moved through the environment.

6. The method of claim 1, wherein the request to determine distortion comprises a particular motion of the measurement device detected by an accelerometer of the measurement device.

7. The method of claim 6, wherein the particular motion is a rotation of the measurement device over a horizontal axis.

8. The method of claim 1, further comprising:
    computing a level of distortion at one or more locations of the environment based on the measured electromagnetic fields at the one or more locations of the environment;
    generating correction data based on the level of distortion and transmitting the correction data to a head-mounted display, wherein the head-mounted display corrects computations of location of sensors using the correction data.

9. The method of claim 1, further comprising:
    generating a data file comprising a plurality of entries, each of the entries comprising a measurement of electromagnetic fields in the environment measured by the receiver and a timestamp corresponding to a time when the measurement was taken;
    receiving an image of an object in the environment; storing data linking the image of the object to a particular entry of the plurality of entries.

10. The method of claim 1, further comprising:
    generating a data file comprising a plurality of entries, each of the entries comprising a measurement of electromagnetic fields in the environment and a timestamp corresponding to a time when the measurement was taken;
    receiving user input comprising textual data; storing data linking the textual data to a particular entry of the plurality of entries.

11. A system for detecting distortion in an environment in which a virtual reality (VR) headset is to be used, the system comprising:
    a measurement device comprising:
        a transmitter affixed to a rigid body configured to transmit electromagnetic fields at one or more first frequencies; and
        a receiver affixed to the rigid body at a fixed position and orientation relative to the transmitter configured to measure electromagnetic fields at the one or more first frequencies and transmit measurements of electromagnetic fields to a computing device at one or more second frequencies;

the computing device configured to:
receive the measurements of electromagnetic fields from the receiver;
compute levels of distortion or interference based on the measurements of electromagnetic fields received from the receiver; and
display said levels of distortion in real-time as the measurement device is moved through the environment; and wherein the measurement device is configured to:
in response to receiving a request to measure interference at a current location in the environment, measure electromagnetic fields from the receiver without transmitting electromagnetic fields from the transmitter;
detect an input to switch from interference measurement to distortion measurement at the current location;
in response to the detected input to switch, at the current location, transmit the electromagnetic fields from the transmitter at the one or more first frequencies and the measuring electromagnetic fields at the receiver at the one or more first frequencies; and
if the distortion is less than a threshold, identify the current location as usable.

12. The system of claim 11, wherein the computing device is configured to compute a level of distortion by:
computing, based on measurements of electromagnetic fields from the receiver while the transmitter is transmitting electromagnetic fields, a position and orientation of the receiver relative to the transmitter;
computing a difference between the computed position and orientation and a stored value comprising the fixed position and orientation of the receiver with respect to the transmitter;
based on the difference, computing a level of distortion in a location of the measurement device.

13. The system of claim 11, wherein the measurement device further comprises an accelerometer affixed to the rigid body, wherein the request to measure distortion in the environment is detected by the accelerometer as a rotation of the rigid body.

14. The system of claim 11, wherein the computing device is configured to display, with the real-time measurements of electromagnetic fields, an indication of a threshold value indicating a maximum level of interference or distortion.

15. The system of claim 11, wherein the computing device is configured to compute a number of dropped packets in communications between the computing device and the receiver as the measurement device is moved through the environment.

* * * * *